United States Patent
Hahn et al.

(10) Patent No.: US 10,567,006 B2
(45) Date of Patent: Feb. 18, 2020

(54) DATA RELOCATION

(71) Applicant: SANDISK TECHNOLOGIES LLC, Plano, TX (US)

(72) Inventors: Judah Gamliel Hahn, Ofra (IL); Igor Genshaft, Bat Yam (IL); Marina Frid, Jerusalem (IL)

(73) Assignee: Sandisk Technologies LLC, Plano, TX (US)

( * ) Notice: Subject to any disclaimer, the term of this patent is extended or adjusted under 35 U.S.C. 154(b) by 11 days.

(21) Appl. No.: 15/229,252

(22) Filed: Aug. 5, 2016

(65) Prior Publication Data
US 2018/0039541 A1 Feb. 8, 2018

(51) Int. Cl.
*G06F 11/10* (2006.01)
*H03M 13/29* (2006.01)
*G06F 3/06* (2006.01)

(52) U.S. Cl.
CPC ........ *H03M 13/2906* (2013.01); *G06F 3/065* (2013.01); *G06F 3/0619* (2013.01); *G06F 3/0656* (2013.01); *G06F 3/0679* (2013.01); *G06F 3/0688* (2013.01); *G06F 11/108* (2013.01); *G06F 11/1012* (2013.01)

(58) Field of Classification Search
CPC .... G06F 11/1076; G06F 3/0619; G06F 3/064; G06F 6/0647; G06F 3/0673; H03M 13/2906
See application file for complete search history.

(56) References Cited

U.S. PATENT DOCUMENTS

| | | | | |
|---|---|---|---|---|
| 5,255,270 A | * | 10/1993 | Yanai | G06F 11/1435 360/53 |
| 5,754,567 A | * | 5/1998 | Norman | G06F 11/1068 365/185.09 |
| 6,526,477 B1 | * | 2/2003 | Yuan | G06F 3/061 710/52 |
| 8,122,328 B2 | * | 2/2012 | Liu | G06F 11/1068 714/782 |
| 8,621,323 B2 | | 12/2013 | Gorobets et al. | |
| 2007/0067705 A1 | * | 3/2007 | Kim | G06F 11/1068 714/801 |
| 2012/0072693 A1 | * | 3/2012 | Mori | G06F 3/0604 711/165 |
| 2015/0149858 A1 | * | 5/2015 | Cha | G06F 11/10 714/763 |
| 2015/0309744 A1 | * | 10/2015 | Takeuchi | G06F 11/1666 714/764 |
| 2015/0309862 A1 | * | 10/2015 | Han | G06F 11/1064 714/801 |
| 2016/0026406 A1 | | 1/2016 | Hahn et al. | |
| 2017/0286217 A1 | * | 10/2017 | Kreifels | H03M 13/19 |

FOREIGN PATENT DOCUMENTS

WO 2011148223 A1 12/2011

* cited by examiner

*Primary Examiner* — Kyle Vallecillo
(74) *Attorney, Agent, or Firm* — Patterson & Sheridan, LLP; Steven H. Versteeg

(57) ABSTRACT

A data storage device includes a memory device and a controller coupled to the memory device. The controller is configured, during execution of a relocation operation that includes storage of data to a memory buffer of an access device and retrieval of the data including data bits and first error correction code (ECC) parity bits from the memory buffer, to generate second ECC parity bits based on the data bits from the memory buffer and to compare the first ECC parity bits to the second ECC parity bits.

20 Claims, 5 Drawing Sheets

NON-VOLATILE MEMORY SYSTEM 300

HIERARCHICAL STORAGE SYSTEM 350

DATA RELOCATION

FIELD OF THE DISCLOSURE

This disclosure is generally related to data storage devices and more particularly to performing data relocation operations.

BACKGROUND

Non-volatile data storage devices, such as flash solid state drive (SSD) memory devices or removable storage cards, have allowed for increased portability of data and software applications. Flash memory devices can enhance data storage density by storing multiple bits in each flash memory cell. For example, Multi-Level Cell (MLC) flash memory devices provide increased storage density by storing 2 bits per cell, 3 bits per cell, 4 bits per cell, or more. Increasing the number of bits per cell and reducing device feature dimensions may increase a storage density of a memory device.

During execution of a relocation operation to relocate data from a first portion of a memory device to a second portion of the memory device, a data storage device may temporarily store data (that is to be relocated) to a portion of memory on an access device, such as a host memory buffer (HMB) of the access device. The data storage device may subsequently read the data stored at the HMB and write it to the second portion, thereby completing the relocation operation. However, the data stored in the HMB may become corrupted or may be overwritten, resulting in incorrect or erroneous data being written to the memory device.

DETAILED DESCRIPTION

Particular examples in accordance with the disclosure are described below with reference to the drawings. In the description, common features are designated by common reference numbers. As used herein, "exemplary" may indicate an example, an implementation, and/or an aspect, and should not be construed as limiting or as indicating a preference or a preferred implementation. Further, it is to be appreciated that certain ordinal terms (e.g., "first" or "second") may be provided for identificatoin and ease of reference and do not necessarily imply physical characteristics or ordering. Therefore, as used herein, an ordinal term (e.g., "first," "second," "third," etc.) used to modify an element, such as a structure, a component, an operation, etc., does not necessarily indicate priority or order of the element with respect to another element, but rather distinguishes the element from another element having a same name (but for use of the ordinal term). In addition, as used herein, indefinite articles ("a" and "an") may indicate "one or more" rather than "one." As used herein, a structure or operation that "comprises" or "includes" an element may include one or more other elements not explicitly recited. Further, an operation performed "based on" a condition or event may also be performed based on one or more other conditions or events not explicitly recited.

Figure 1:
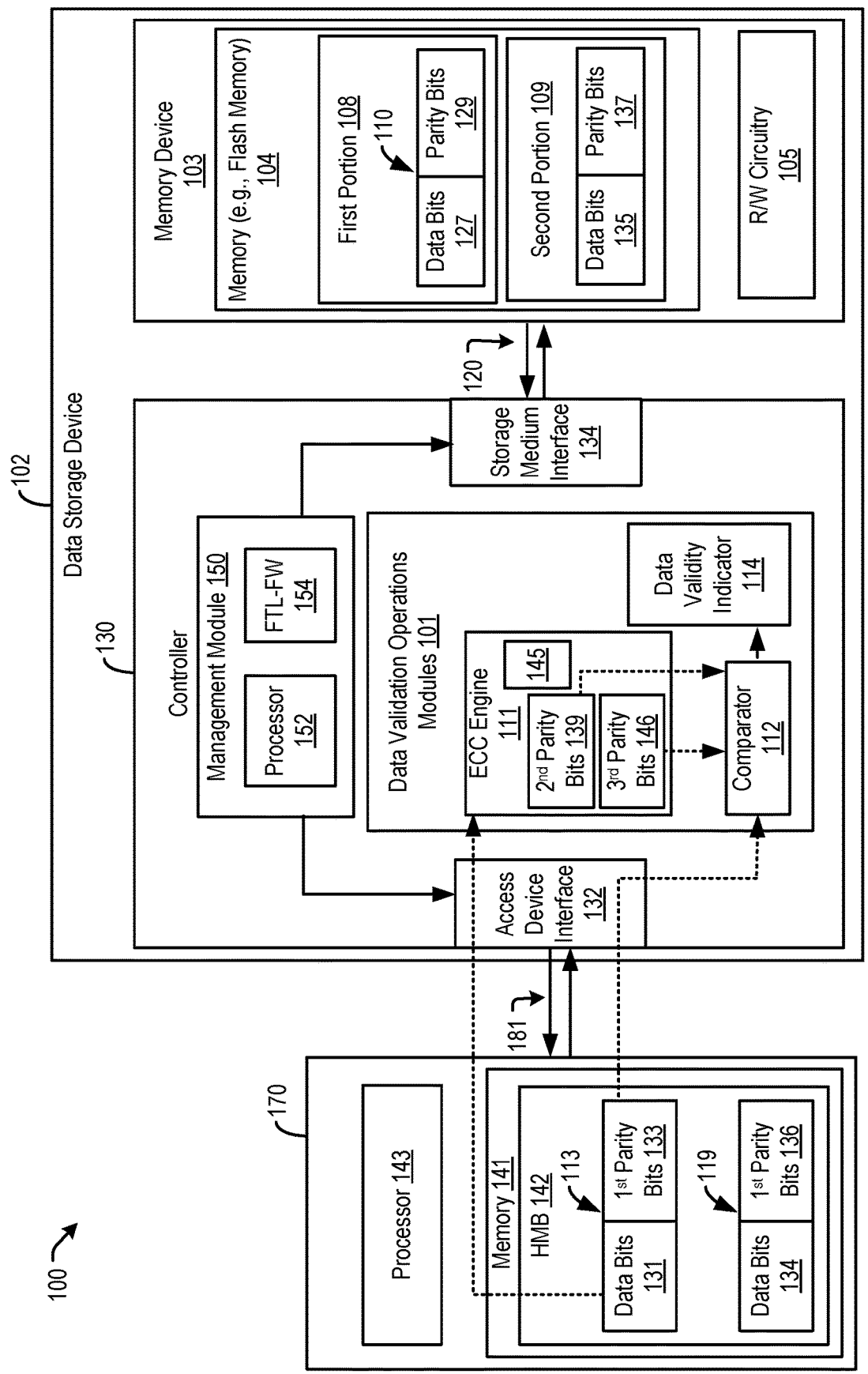
FIG. 1 is a block diagram of an illustrative example of a system including a data storage device configured to perform a relocation operation that includes storing data to a HMB and generating parity bits based on data read from the HMB.

FIG. 1 depicts an illustrative example of a system 100 that includes a data storage device 102 and an access device 170 (e.g., a host device or another device). The data storage device 102 is configured to perform a relocation operation as described further herein.

The data storage device 102 and the access device 170 may be coupled via a connection (e.g., a communication path 181), such as a bus or a wireless connection. The data storage device 102 may include a first interface 132 (e.g., an access device or host interface) that enables communication via the communication path 181 between the data storage device 102 and the access device 170.

The data storage device 102 may include or may correspond to a solid state drive (SSD) which may be included in, or distinct from (and accessible to), the access device 170. For example, the data storage device 102 may include or correspond to an SSD, which may be used as an embedded storage drive (e.g., a mobile embedded storage drive), an enterprise storage drive (ESD), a client storage device, or a cloud storage drive, as illustrative, non-limiting examples. In some implementations, the data storage device 102 is coupled to the access device 170 indirectly, e.g., via a network. For example, the network may include a data center storage system network, an enterprise storage system network, a storage area network, a cloud storage network, a local area network (LAN), a wide area network (WAN), the Internet, and/or another network. In some implementations, the data storage device 102 may be a network-attached storage (NAS) device or a component (e.g., a solid-state drive (SSD) device) of a data center storage system, an enterprise storage system, or a storage area network.

In some implementations, the data storage device 102 may be embedded within the access device 170, such as in accordance with a Joint Electron Devices Engineering Council (JEDEC) Solid State Technology Association Universal Flash Storage (UFS) configuration. For example, the data storage device 102 may be configured to be coupled to the access device 170 as embedded memory, such as eMMC® (trademark of JEDEC Solid State Technology Association, Arlington, Va.) and eSD, as illustrative examples. To illustrate, the data storage device 102 may correspond to an eMMC (embedded MultiMedia Card) device. As another example, the data storage device 102 may correspond to a memory card, such as a Secure Digital (SD®) card, a microSD® card, a miniSD™ card (trademarks of SD-3C LLC, Wilmington, Del.), a MultiMediaCard™ (MMC™) card (trademark of JEDEC Solid State Technology Association, Arlington, Va.), or a CompactFlash® (CF) card (trademark of SanDisk Corporation, Milpitas, Calif.). Alternatively, the data storage device 102 may be removable from the access device 170 (i.e., "removably" coupled to the access device 170). As an example, the data storage device 102 may be removably coupled to the access device 170 in accordance with a removable universal serial bus (USB) configuration.

The data storage device 102 may operate in compliance with an industry specification. For example, the data storage device 102 may include a SSD and may be configured to communicate with the access device 170 using a small computer system interface (SCSI)-type protocol, such as a serial attached SCSI (SAS) protocol. As other examples, the data storage device 102 may be configured to communicate with the access device 170 using a NVM Express (NVMe) protocol or a serial advanced technology attachment (SATA) protocol. In other examples, the data storage device 102 may operate in compliance with a JEDEC eMMC specification, a JEDEC UFS specification, one or more other specifications, or a combination thereof, and may be configured to communicate using one or more protocols, such as an eMMC protocol, a universal flash storage (UFS) protocol, a universal serial bus (USB) protocol, and/or another protocol, as illustrative, non-limiting examples.

The access device 170 may include a memory interface (not shown) and may be configured to communicate with the data storage device 102 via the memory interface to read data from and write data to a memory device 103 of the data storage device 102. For example, the access device 170 may be configured to communicate with the data storage device 102 using a SAS, SATA, or NVMe protocol. As other examples, the access device 170 may operate in compliance with a JEDEC industry specification, such as a UFS Access Controller Interface specification. The access device 170 may communicate with the memory device 103 in accordance with any other suitable communication protocol.

The access device 170 may include a processor 143 and a memory 141. The memory 141 may be configured to store data and/or instructions that may be executable by the processor 143. The memory 141 may be a single memory or may include multiple memories, such as one or more nonvolatile memories, one or more volatile memories, or a combination thereof. The memory 141 may include a memory buffer, such as a host memory buffer (HMB) 142. The HMB 142 may be allocated for use by a controller 130 of the data storage device 102.

The access device 170 may issue one or more commands to the data storage device 102, such as one or more requests to erase data, read data from, or write data to a memory device 103 of the data storage device 102. For example, the access device 170 may be configured to provide data to be stored at the memory device 103 or to request data to be read from the memory device 103. The access device 170 may include a mobile telephone, a computer (e.g., a laptop, a tablet, or a notebook computer), a music player, a video player, a gaming device or console, an electronic book reader, a personal digital assistant (PDA), a portable navigation device, a computer, such as a laptop computer or notebook computer, a network computer, a server, any other electronic device, or any combination thereof, as illustrative, non-limiting examples.

The memory device 103 of the data storage device 102 may include one or more memory dies (e.g., one memory die, two memory dies, eight memory dies, or another number of memory dies). The memory device 103 includes a memory 104, such as a non-volatile memory of storage elements included in a memory die of the memory device 103. For example, the memory 104 may include a flash memory, such as a NAND flash memory, or a resistive memory, such as a resistive random access memory (ReRAM), as illustrative, non-limiting examples. In some implementations, the memory 104 may include or correspond to a memory die of the memory device 103. The memory 104 may have a three-dimensional (3D) memory configuration. As an example, the memory 104 may have a 3D vertical bit line (VBL) configuration. In a particular implementation, the memory 104 is a non-volatile memory having a 3D memory configuration that is monolithically formed in one or more physical levels of arrays of memory cells having an active area disposed above a silicon substrate. Alternatively, the memory 104 may have another configuration, such as a two-dimensional (2D) memory configuration or a non-monolithic 3D memory configuration (e.g., a stacked die 3D memory configuration).

Although the data storage device 102 is illustrated as including the memory device 103, in other implementations the data storage device 102 may include multiple memory devices that may be configured in a similar manner as described with respect to the memory device 103. For example, the data storage device 102 may include multiple memory devices, each memory device including one or more packages of memory dies, each package of memory dies including one or more memories such as the memory 104.

The memory 104 may include one or more blocks, such as a NAND flash erase group of storage elements. Each storage element of the memory 104 may be programmable to a state (e.g., a threshold voltage in a flash configuration or a resistive state in a resistive memory configuration) that indicates one or more values. Each block of the memory 104 may include one or more word lines. Each word line may include one or more pages, such as one or more physical pages. In some implementations, each page may be configured to store a codeword. A word line may be configurable to operate as a single-level-cell (SLC) word line, as a multi-level-cell (MLC) word line, or as a tri-level-cell (TLC) word line, as illustrative, non-limiting examples.

The memory 104 may include a first portion 108 and a second portion 109. The first portion 108 may store data 110 including data bits 127 and parity bits 129.

The memory device 103 may include support circuitry, such as read/write circuitry 105, to support operation of one or more memory dies of the memory device 103. Although depicted as a single component, the read/write circuitry 105 may be divided into separate components of the memory device 103, such as read circuitry and write circuitry. The read/write circuitry 105 may be external to the one or more dies of the memory device 103. Alternatively, one or more individual memory dies of the memory device 103 may include corresponding read/write circuitry that is operable to read data from and/or write data to storage elements within the individual memory die independent of any other read and/or write operations at any of the other memory dies.

The controller 130 is coupled to the memory device 103 via a bus 120, an interface (e.g., interface circuitry, such as a second interface 134), another structure, or a combination thereof. For example, the bus 120 may include one or more channels to enable the controller 130 to communicate with a single memory die of the memory device. As another example, the bus 120 may include multiple distinct channels to enable the controller 130 to communicate with each memory die of the memory device 103 in parallel with, and independently of, communication with other memory dies of the memory device 103.

The controller 130 is configured to receive data and instructions from the access device 170 and to send data to the access device 170. For example, the controller 130 may send data to the access device 170 via the first interface 132, and the controller 130 may receive data from the access device 170 via the first interface 132. The controller 130 is configured to send data and commands to the memory 104 and to receive data from the memory 104. For example, the controller 130 is configured to send data and a write command to cause the memory 104 to store data to a specified address of the memory 104. The write command may specify a physical address of a portion of the memory 104 (e.g., a physical address of a word line of the memory 104) that is to store the data. The controller 130 may also be configured to send data and commands to the memory 104 associated with background scanning operations, garbage collection operations, wear leveling operations, relocation operations, etc., as illustrative, non-limiting examples.

The controller 130 includes a management module 150 and data validity operations modules 101. The management module 150 includes one or more processors 152 and flash translation layer (FTL) and firmware (FW) 154. The one or more processors 152 may have access to the FTL-FW 154 to control operation of the data storage device 102. The FTL-FW 154 may use information stored in a control table (not illustrated) to translate access device accesses to memory device 103 accesses. The one or more processors 152 may maintain a mapping table (not illustrated), e.g., in a cache memory (not illustrated). Upon completion of a relocation operation to move data from the first portion 108 of the memory 104 to the second portion 109 of the memory 104, the one or more processors 152 may update the mapping table to reflect the new location (e.g., the second portion 109) of the relocated data.

The data validity operations modules 101 include an error correction code (ECC) engine 111, a comparator 112, and a data validity indicator 114. The ECC engine 111 is configured to receive data to be stored to the memory 104 and to generate a codeword. For example, the ECC engine 111 may include an encoder configured to encode data using an ECC scheme, such as a Reed Solomon encoder, a Bose-Chaudhuri-Hocquenghem (BCH) encoder, a low-density parity check (LDPC) encoder, a Turbo Code encoder, an encoder configured to encode one or more other ECC encoding schemes, or any combination thereof. The ECC engine 111 may include one or more decoders configured to decode data read from the memory 104 to detect and correct, up to an error correction capability of the ECC scheme, any bit errors that may be present in the data. The comparator 112 is configured to compare parity bits read from the HMB 142 to parity bits generated by the ECC engine 111 as described in more detail below. The data validity indicator 114 may store a value or issue an instruction that either causes the controller 130 to write data read from the HMB 142 to the second portion 109 or to re-execute the relocation operation as described in more detail below. Additionally or alternatively, the data validity indicator 114 may store a value or may issue an instruction that causes the controller 130 to perform an ECC operation to generate corrected data and to write the corrected data to the second portion 109.

The controller 130 may be configured to perform a relocation operation to store data from one portion of the memory 104 to another portion of the memory 104. For example, the controller 130 may be configured to perform a relocation operation to store the data 110 read from the first portion 108 of the memory 104 (or data based on the data 110 read from the first portion 108) to the second portion 109 of the memory 104. The controller 130 may be configured to perform the relocation operation in part by reading the data 110 from the first portion 108 of the memory 104, storing the data to the HMB 142, reading the data from the HMB 142, and performing one or more data validation operations using the data validation operations modules 101 to validate the data to be relocated before writing the data to the second portion 109 and deleting the data 110 from the first portion 108 or marking the data as invalid or non-used.

During performance of a relocation operation to relocate the data 110 from the first portion 108 to the second portion 109, the controller 130 may read the data 110 from the first portion 108. The controller 130 may store (to the HMB 142) data that corresponds to or is based on the data 110 read from the first portion 108. For example, the controller 130 may store data 113 including data bits 131 and first parity bits 133 to the HMB 142, and the data 113 stored to the HMB 142 may be based on the data 110 read from the first portion 108.

In some examples, the controller 130 may not modify the data 110 prior to storing the data 113 to the HMB 142. In these examples, the data 113 stored to the HMB 142 may correspond to (e.g., match) the data 110 read from the first portion 108 and may include the data bits 127 and the parity bits 129 as read from the first portion 108. In this example, the data bits 131 correspond to the data bits 127 and the first parity bits 133 correspond to the parity bits 129.

Alternatively or additionally, the controller 130 may modify or manipulate the data 110 to generate the data 113 prior to storing the data 113 to the HMB 142. For example, the data 110 read from the first portion 108 may be provided to the ECC engine 111. The ECC engine 111 may include one or more decoders configured to decode data read from the memory 104 to detect and correct, up to an error correction capability of the ECC scheme, any bit errors that may be present in the data. In some examples, the ECC engine 111 may perform a validation and correction operation on the data bits 127 and the parity bits 129. In these examples, the data bits 131 and the parity bits 133 of the data 113 stored to the HMB 142 may correspond to the data bits 127 and the parity bits 129, respectively, as corrected by the ECC engine 111. Alternatively or additionally, the ECC engine 111 may decode the data 110 to generate the data bits 131 and re-encode the data bits 131 to generate new parity bits. In this example, the first parity bits 133 may correspond to the newly generated parity bits generated by the ECC engine 111 based on the data 110 read from the first portion 108.

Thus, during execution of the relocation operation to relocate the data 110 from the first portion 108 to the second portion 109, the controller 130 may read the data 110 from the first portion 108, may modify or manipulate the data 110 to generate corrected data bits and new parity bits, and may store the data 110 as read from the first portion 108, or data based on the data 110 read from the first portion 108, to the HMB 142.

Performance of the relocation operation to relocate the data 110 from the first portion 108 to the second portion 109 additionally includes retrieving (e.g., reading), by the controller 130, the data 113 from the HMB 142. For example, the controller 130 may send a request to the access device 170 for the data 113 and may receive the data 113 from the access device 170 via the communication path 181.

In some examples, the controller 130 may provide the data bits 131 of the data 113 to the ECC engine 111, and the ECC engine 111 may generate second parity bits 139 based on the data bits 131 of the data 113 read from the HMB 142. For example, the ECC engine 111 may generate the second parity bits 139 according to a same ECC scheme used to generate the first parity bits 133. The controller 130 may provide the first parity bits 133 of the data 113 read from the HMB 142 and the second parity bits 139 to the comparator 112. The comparator 112 may compare the first parity bits 133 to the second parity bits 139 to determine whether the first parity bits 133 and the second parity bits 139 match.

By generating new parity bits based on the data bits of the data read from the HMB 142 and comparing the new parity bits to the parity bits of the data read from the HMB 142, the controller 130 may be able to determine whether the data bits of the data read from the HMB 142 have been corrupted or overwritten during the period in which the data 113 is stored at the HMB 142. As described in more detail below, the controller 130 may be configured to perform an operation, such as writing, data correction, or re-execution of the relocation operation based on whether the data bits of the data read from the HMB 142 were corrupted or overwritten.

In some examples, the comparator 112 may output a signal to the data validity indicator 114 indicative of whether the first parity bits 133 match the second parity bits 139. The data validity indicator 114 may store a value (or may issue an instruction) that causes the controller 130 to perform an operation. For example, as described in more detail below, the data validity indicator 114 may cause the controller 130 to write data based on the data 113 that was read from the HMB 142 to the second portion 109 based on the output signal from the comparator 112.

To illustrate, the comparator 112 may determine that the first parity bits 133 match the second parity bits 139 and may output a signal to the data validity indicator 114 indicative of a match. The data validity indicator 114 may store a value or may issue an instruction that causes the controller 130 to write the data 113 read from the HMB 142 to the second portion 109. In this example, the data bits 135 may correspond to (e.g., match) the data bits 131 of the data 113 read from the HMB 142 and the parity bits 137 may correspond to the first parity bits 133 of the data 113. Thus, the controller 130 may be configured to write data read from the HMB 142 during execution of a relocation operation to a second portion of the memory device when the controller 130 determines that the parity bits 139 generated based on the data 113 read from the HMB 142 match the first parity bits 133 of the data 113 read from the HMB 142.

As another example, the comparator 112 may determine that the first parity bits 133 do not match the second parity bits 139 and may output a signal to the data validity indicator 114 indicative of a mismatch. The data validity indicator 114 may store a value, or may issue an instruction, that causes the controller 130 not to write the data 113 to the second portion 109 and that causes the controller 130 to re-execute the relocation operation (e.g., that causes the controller 130 to perform a second iteration of the relocation operation). In this example, the controller 130 may re-read the data 110 (e.g., may perform a second read operation to read the data 110) from the first portion 108. The controller 130 may modify or manipulate the data read from the first portion 108 during the second read operation to generate second data 119 having data bits 134 and first parity bits 136 and may store the second data 119 to the HMB 142 (e.g., the second data 119 may correspond to the data 110 read during the second read operation and modified to include corrected data bits and/or newly generated parity bits). Alternatively, the controller 130 may not modify or manipulate the data 110 read from the first portion 108 during the second read operation prior to storing the second data 119 to the HMB 142 (e.g., the second data 119 may correspond to the data 110 read from the first portion 108 during the second read operation).

The controller 130 may read the second data 119 from the HMB 142 and may provide the second data 119 to the ECC engine 111. The ECC engine 111 may generate third parity bits 146 based on the data bits 134 of the second data 119 read from the HMB 142. The controller 130 may provide the first parity bits 136 and the third parity bits 146 to the comparator 112. The comparator 112 may compare the first parity bits 136 and the third parity bits 146 and may output a signal to the data validity indicator 114 indicative of whether the first parity bits 136 match the third parity bits 146 as described above. The data validity indicator 114 may store a value or issue an instruction that either causes the controller 130 to write the second data 119 read from the HMB 142 to the second portion 109 or re-execute the relocation operation.

Thus, the controller 130 may be configured to not write data read from the HMB 142 to the second portion 109 of the memory device when the controller 130 determines that the parity bits generated based on the data read from the HMB 142 do not match the parity bits of the data read from the HMB 142. The controller 130 may instead re-execute the relocation operation (e.g., may perform a second iteration of the relocation operation) when the controller 130 determines that the parity bits generated based on the data read from the HMB 142 do not match the parity bits of the data read from the HMB 142.

In other examples, the controller 130 may provide the data 113 to the ECC engine 111, and the ECC engine 111 may perform a decode operation using the data bits 131 and the first parity bits 133. In some implementations, the decode operation may include encoding the data bits 131 to generate the second parity bits 139 and comparing the second parity bits 139 to the parity bits 133 (e.g., via a bit-wise XOR operation) at the comparator 112 to generate a syndrome vector. The syndrome vector may be processed by the ECC engine 111 to detect and correct errors in the data bits 131. In other implementations, the decode operation may include processing the data 113 at syndrome generation circuitry (e.g., one or more XOR trees) to generate the syndrome vector. The syndrome generation circuitry may correspond to a multiplication of the data 113 by the parity check matrix H of the ECC scheme that was used to encode the data bits 131. The syndrome generation circuitry may perform a series of XOR operations that generate a parity bit based on the data bits 131 (e.g., a parity bit of the second set of parity bits 139) and that compare the generated parity bit to the corresponding bit of the first parity bits 133. Thus, the syndrome generation circuitry may incorporate the comparator 112 and perform a comparison of the first parity bits 133 to the second parity bits 139 during generation of the syndrome vector.

The decode operation may be successful when the data 113 includes no errors or when the data 113 includes a number of errors within a correction capability of the ECC engine 111 (e.g., when the data 113 includes a correctable number of errors). When the data 113 includes a correctable number of errors, the decode operation includes correcting the errors in the data bits 131, resulting in corrected data bits 145. In this example, the ECC engine 111 may generate the second parity bits 139 based on the corrected data bits 145. The decode operation may be unsuccessful when the data 113 includes a number of errors that exceeds the correction capability of the ECC engine 111 (e.g., when the data bits 131 include an uncorrectable number of errors). When the decode operation is unsuccessful, the decode operation includes indicating that the decode operation failed. By performing a decode operation on the data 133, the controller 130 may be able to determine whether the data bits 131 of the data 113 read from the HMB 142 have been corrupted or overwritten during the period in which the data 113 is stored at the HMB 142. The controller 130 may be configured to perform an operation, such as writing, data correction, or re-execution of the relocation operation based on whether the data bits of the data read from the HMB 142 were corrupted or overwritten (e.g., based on whether the decode operation is successful).

In some examples, the ECC engine 111 may output a signal to the data validity indicator 114 indicative of whether the decode operation is successful. The data validity indicator 114 may store a value that causes the controller 130 to perform an operation. For example, the data validity indicator 114 may cause the controller 130 to write the corrected data 145 and the second parity bits 139 to the second portion 109 based on the output signal from the ECC engine 111.

To illustrate, the ECC engine 111 may process the syndrome vector generated based on comparing the first parity bits 133 to the second parity bits 139 as described above, and may determine that the data 113 includes no errors or includes a correctable number of errors (e.g., the decode operation may be successful). In this example, the ECC engine 111 may output a signal to the data validity indicator 114 indicative of a successful decode. The data validity indicator 114 may store a value or may issue an instruction that causes the controller 130 to write the data 113 to the second portion 109 (when there are no errors in the data 113) or to write the corrected data bits 145 and the second parity bits 139 (that are generated based on the corrected data bits 145) to the second portion 109 (when the data 113 includes a correctable number of errors). In this example, the data bits 135 may correspond to (e.g., match) the data bits 131 or to the corrected data bits 145 and the parity bits 137 may correspond to the second parity bits 139 generated based on the data 113 or generated based on the corrected data bits 145. Alternatively or additionally, the decode operation may be unsuccessful and the ECC engine 111 may output a signal to the data validity indicator 114 indicative of an unsuccessful decode. The data validity indicator 114 may store a value or may issue an instruction that causes the controller 130 to not write data based on the data 113 read from the HMB 142 to the second portion 109 and that causes the controller 130 to re-execute the relocation operation Thus, the controller 130 may be configured to perform an operation based on whether the data bits of the data read from the HMB 142 were corrupted (or sufficiently corrupted) or overwritten as indicated by a decode operation or based on a comparison of parity bits generated based on data read from the HMB 142 to parity bits of the data read from the HMB 142.

Figure 2:
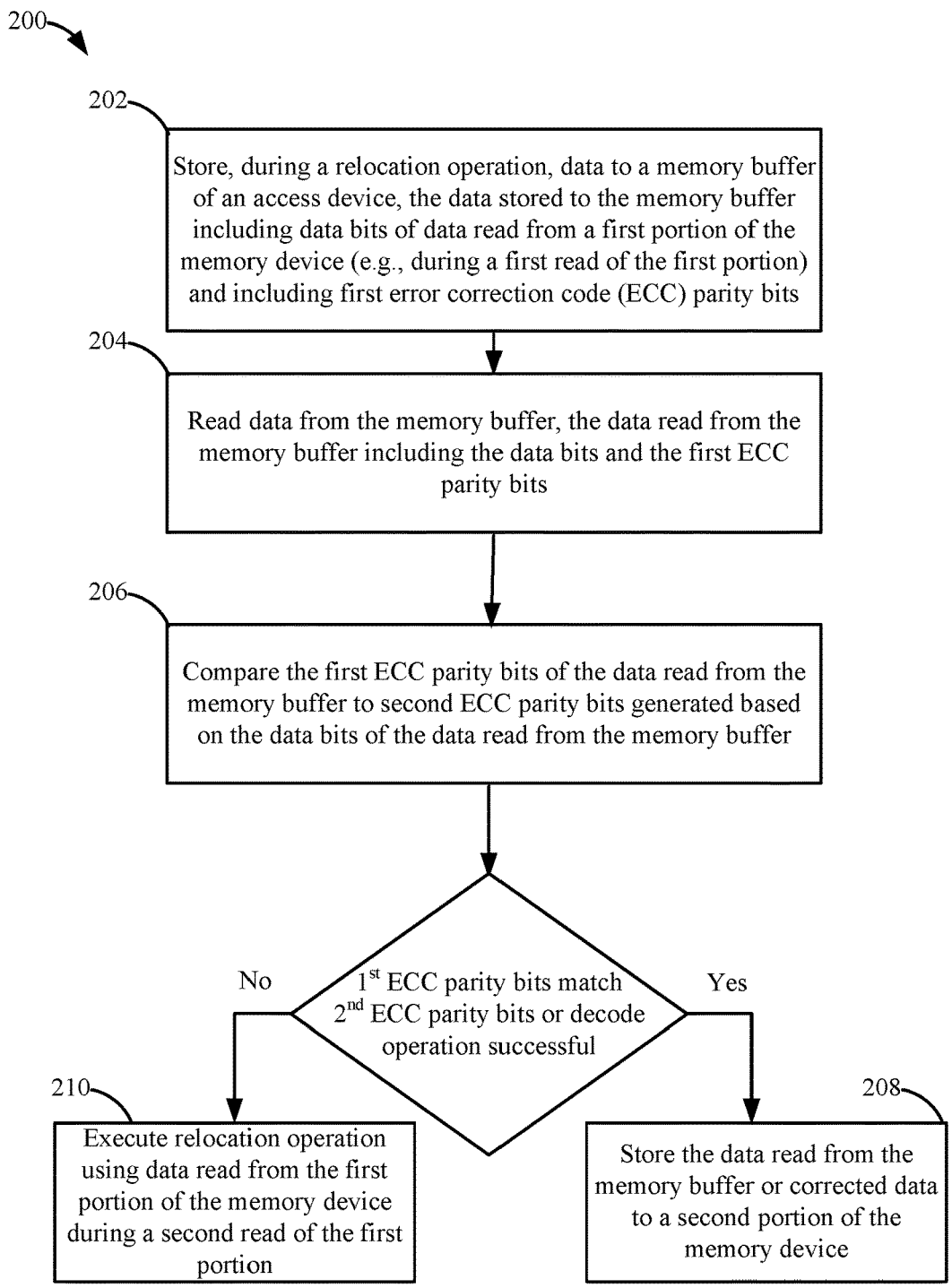
FIG. 2 is a flow diagram of a particular example of method of operation that may be performed by the data storage device of FIG. 1.

Referring to FIG. 2, a particular illustrative example of a method of operation of a device is depicted and generally designated 200. The method 200 may be performed at a data storage device, such as the controller 130 coupled to the memory device 103 of FIG. 1.

The method 200 includes, at 202, storing, during a relocation operation, data to a host memory buffer of an access device. The data stored to the host memory buffer includes data bits based on data read from a first portion of the memory device and including first ECC parity bits. For example, the host memory buffer may correspond to the HMB 142, the first portion may correspond to the first portion 108, the data read from the first portion may correspond to the data 110, the data stored to the host memory buffer may correspond to the data 110 or may correspond to data that includes data bits corrected by an ECC or that includes newly generated parity bits as described above with reference to the data 113 of FIG. 1.

The method 200 further includes, at 204, reading data from the host memory buffer. The data read from the host memory buffer includes the data bits and the first ECC parity bits. In some examples, the data read from the host memory buffer may correspond to the data 113 read from the HMB 142 as described above with reference to FIG. 1. In some examples, the data 113 read from the host memory buffer may be different than the data 113 stored to the host memory buffer because the data 113 stored to the host memory buffer may become corrupted or may be overwritten while the data 113 is in the HMB 142 prior to the controller 130 reading the data 113 from the HMB 142.

The method 200 further includes, at 206, comparing the first ECC parity bits of the data read from the host memory buffer to second ECC parity bits generated based on the data bits of the data read form the host memory buffer. For example, as described above, the ECC engine 111 may receive the data 113 (or the data bits 131 of the data 113) read from the HMB 142 and may generate the second parity bits 139 based on the data bits of the data 113 read from the HMB 142. The first parity bits 133 of the data 113 read from the HMB 142 may be provided to the comparator 112, which may compare the first parity bits 133 of the data 113 read from the HMB 142 to the second parity bits 139. In other examples, the controller 130 may provide the data 113 to the ECC engine 111, and the ECC engine 111 may, in conjunction with the comparator 112 or syndrome generation circuitry, perform a decode operation using the data bits 131 and the first parity bits 133 as described above. In these examples, a comparison of the first parity bits 133 to the second parity bits 139 may be performed by the comparator 112 (e.g., by syndrome generation circuitry that includes the comparator 112) to generate a syndrome vector used by the ECC engine 111 to detect and/or correct errors in the data 113 as described above with reference to FIG. 1.

The method 200 further includes, at 208, storing data based on the data 113 read from the HMB 142 to the second portion 109 when the comparison indicates a match or when the decode operation is successful. When the comparison indicates a match, the data 113 read from the HMB 142 is written to the second portion 109. When the comparison results in a syndrome vector that indicates no errors or a correctable number of errors (e.g., when the decode operation described above is successful), the data 113 read from the HMB 142 may be written to the second portion 109 or may be provided to the ECC engine 111 (which may generate the corrected data 145 and may write the corrected data 145 to the second portion 109).

The method 200 further includes, at 210, when the comparison indicates a mismatch (or, in some implementations, when the decode operation described above is unsuccessful), re-executing the relocation operation using data read from the first portion of the memory device during a second read of the first portion. For example, the controller 130 of FIG. 1 may store second data 119 based on the data 110 read from the first portion 108 to the HMB 142, may generate third parity bits 146 based on the second data 119 read from the HMB 142, and may compare the third parity bits 146 to the first parity bits 136 of the second data 119 read from the HMB 142.

Figure 3A:
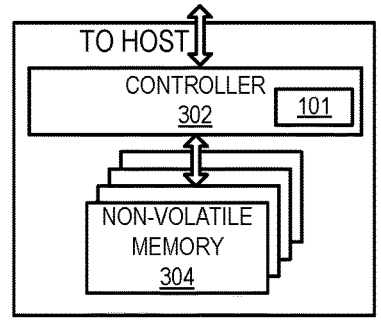
FIG. 3A is a block diagram of an illustrative example of a non-volatile memory system including a controller configured to perform the relocation operation of FIG. 1.
Figure 3B:
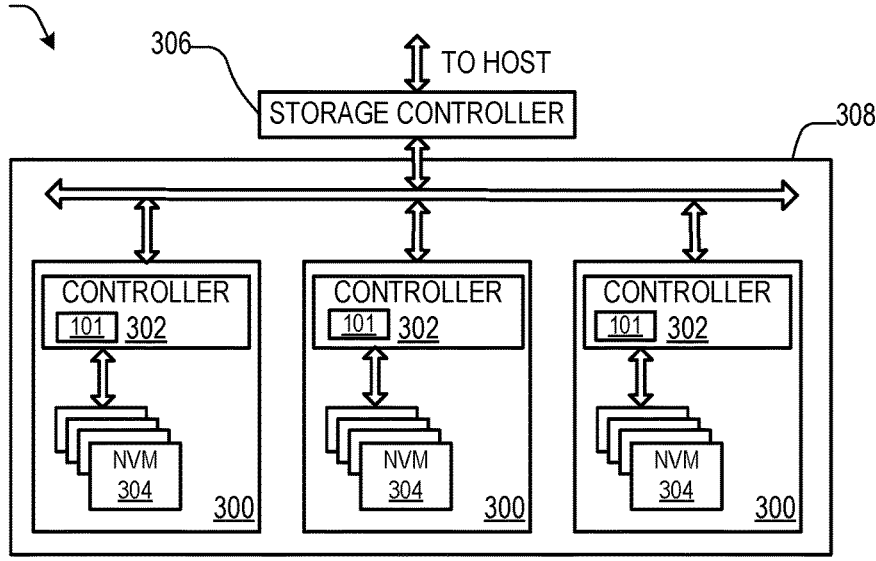
FIG. 3B is a block diagram of an illustrative example of a storage module that includes plural non-volatile memory systems that each may be configured to perform the relocation operation of FIG. 1.
Figure 3C:
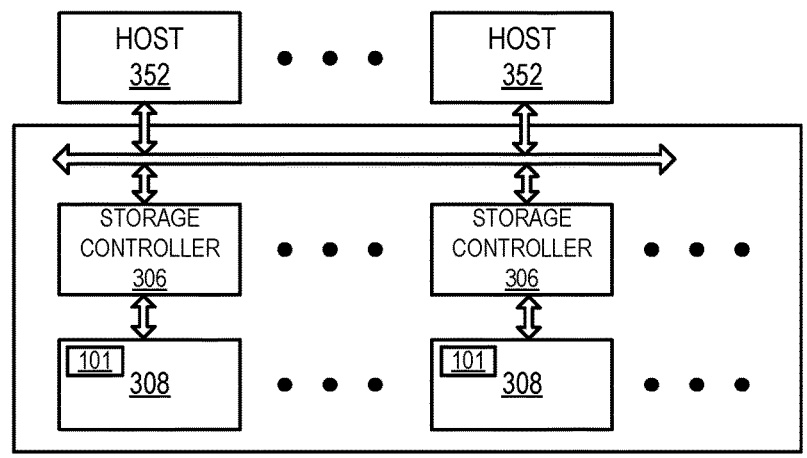
FIG. 3C is a block diagram of an illustrative example of a hierarchical storage system that includes a plurality of storage controllers that each may be configured to perform the relocation operation of FIG. 1.

Memory systems suitable for use in implementing aspects of the disclosure are shown in FIGS. 3A-3C. FIG. 3A is a block diagram illustrating a non-volatile memory system according to an example of the subject matter described herein. Referring to FIG. 3A, a non-volatile memory system 300 includes a controller 302 and non-volatile memory (e.g., the memory device 103 of FIG. 1) that may be made up of one or more non-volatile memory die 304. As used herein, the term "memory die" refers to the collection of non-volatile memory cells, and associated circuitry for managing the physical operation of those non-volatile memory cells, that are formed on a single semiconductor substrate. The controller 302 may correspond to the controller 130 of FIG. 1. Controller 302 interfaces with a host system (e.g., the access device 170 of FIG. 1) and transmits command sequences for read, program, and erase operations to non-volatile memory die 304. The controller 302 may include the data validity operations modules 101 of FIG. 1.

The controller 302 (which may be a flash memory controller) can take the form of processing circuitry, a microprocessor or processor, and a computer-readable medium that stores computer-readable program code (e.g., firmware) executable by the (micro)processor, logic gates, switches, an application specific integrated circuit (ASIC), a programmable logic controller, and an embedded microcontroller, for example. The controller 302 can be configured with hardware and/or firmware to perform the various functions described below and shown in the flow diagrams. Also, some of the components shown as being internal to the controller can be stored external to the controller, and other components can be used. Additionally, the phrase "operatively in communication with" could mean directly in communication with or indirectly (wired or wireless) in communication with through one or more components, which may or may not be shown or described herein.

As used herein, a flash memory controller is a device that manages data stored on flash memory and communicates with a host, such as a computer or electronic device. A flash memory controller can have various functionality in addition to the specific functionality described herein. For example, the flash memory controller can format the flash memory, map out bad flash memory cells, and allocate spare cells to be substituted for future failed cells. Some part of the spare cells can be used to hold firmware to operate the flash memory controller and implement other features. In operation, when a host is to read data from or write data to the flash memory, the host communicates with the flash memory controller. If the host provides a logical address to which data is to be read/written, the flash memory controller can convert the logical address received from the host to a physical address in the flash memory. (Alternatively, the host can provide the physical address.) The flash memory controller can also perform various memory management functions, such as, but not limited to, wear leveling (distributing writes to avoid wearing out specific blocks of memory that would otherwise be repeatedly written to) and garbage collection (after a block is full, moving only the valid pages of data to a new block, so the full block can be erased and reused).

Non-volatile memory die 304 may include any suitable non-volatile storage medium, including NAND flash memory cells and/or NOR flash memory cells. The memory cells can take the form of solid-state (e.g., flash) memory cells and can be one-time programmable, few-time programmable, or many-time programmable. The memory cells can also be single-level cells (SLC), multiple-level cells (MLC), triple-level cells (TLC), or use other memory cell level technologies, now known or later developed. Also, the memory cells can be fabricated in a two-dimensional or three-dimensional fashion.

The interface between controller 302 and non-volatile memory die 304 may be any suitable flash interface, such as Toggle Mode 200, 400, or 800. In one embodiment, non-volatile memory system 300 may be a card based system, such as a secure digital (SD) or a micro secure digital (micro-SD) card. In an alternate embodiment, memory system 300 may be part of an embedded memory system.

Although, in the example illustrated in FIG. 3A, non-volatile memory system 300 (sometimes referred to herein as a storage module) includes a single channel between controller 302 and non-volatile memory die 304, the subject matter described herein is not limited to having a single memory channel. For example, in some NAND memory system architectures (such as the ones shown in FIGS. 3B and 3C), 2, 4, 8 or more NAND channels may exist between the controller and the NAND memory device, depending on controller capabilities. In any of the embodiments described herein, more than a single channel may exist between the controller 302 and the non-volatile memory die 304, even if a single channel is shown in the drawings.

FIG. 3B illustrates a storage module 320 that includes plural non-volatile memory systems 300. As such, storage module 320 may include a storage controller 306 that interfaces with a host and with storage system 308, which includes a plurality of non-volatile memory systems 300. The interface between storage controller 306 and non-volatile memory systems 300 may be a bus interface, such as a serial advanced technology attachment (SATA) or peripheral component interface express (PCIe) interface. Storage module 320, in one embodiment, may be a solid state drive (SSD), such as found in portable computing devices, such as laptop computers, and tablet computers. Each controller 302 of FIG. 3B may include the data validity operations modules 101 of FIG. 1.

FIG. 3C is a block diagram illustrating a hierarchical storage system. A hierarchical storage system 350 includes a plurality of storage controllers 306, each of which controls a respective storage system 308. Host systems 352 may access memories within the hierarchical storage system 350 via a bus interface. In one embodiment, the bus interface may be a Non-Volatile Memory Express (NVMe) or fiber channel over Ethernet (FCoE) interface. In one embodiment, the hierarchical storage system 350 illustrated in FIG. 3C may be a rack mountable mass storage system that is accessible by multiple host computers, such as would be found in a data center or other location where mass storage is needed. Each storage controller 306 of FIG. 3C may include the data validity operations modules 101 of FIG. 1.

Figure 4A:
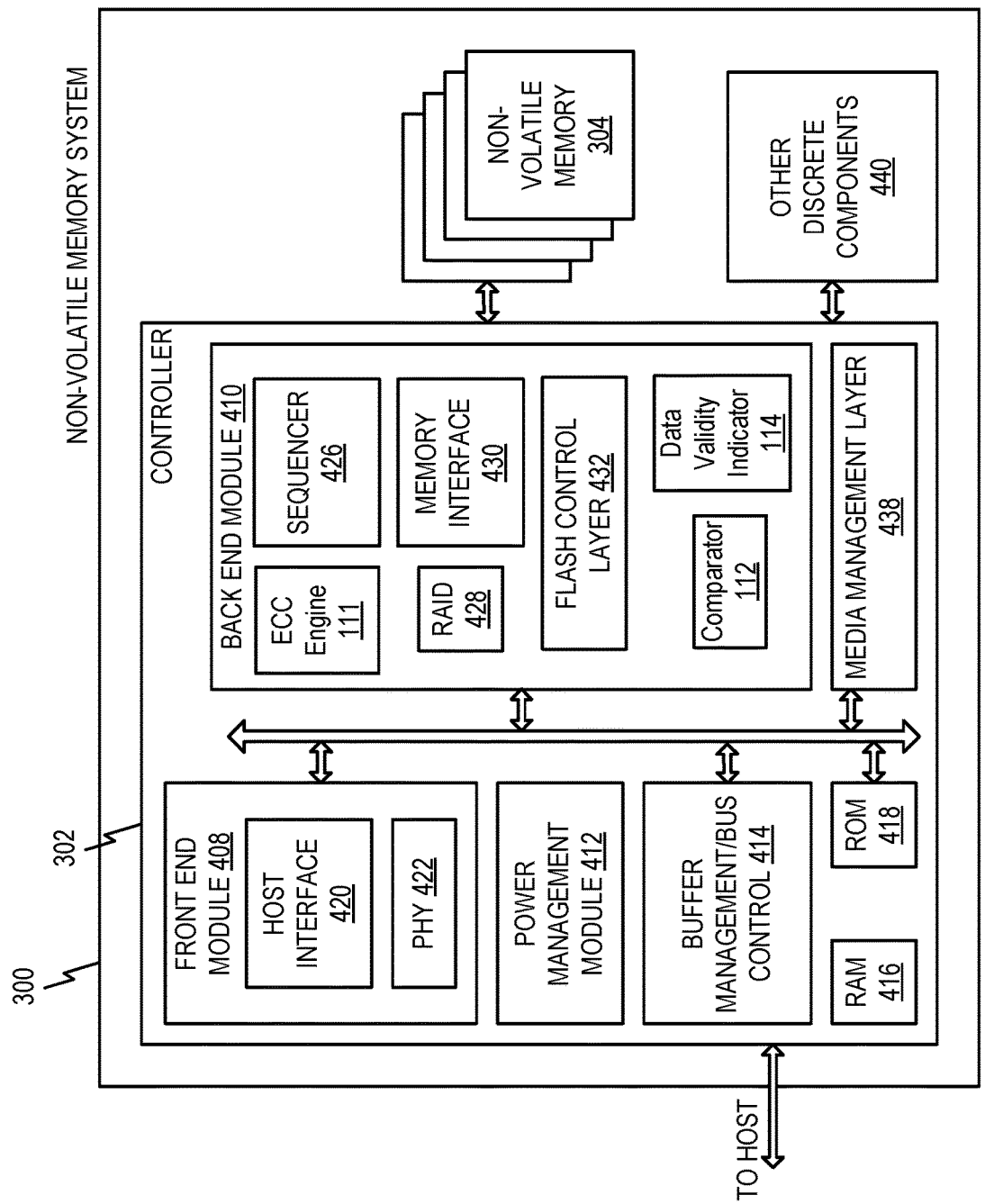
FIG. 4A is a block diagram illustrating an example of a non-volatile memory system including a controller configured to perform the relocation operation of FIG. 1

FIG. 4A is a block diagram illustrating exemplary components of the controller 302 in more detail. The controller 302 includes a front end module 408 that interfaces with a host, a back end module 410 that interfaces with the one or more non-volatile memory die 304, and various other modules that perform other functions. A module may take the form of a packaged functional hardware unit designed for use with other components, a portion of a program code (e.g., software or firmware) executable by a (micro)processor or processing circuitry that usually performs a particular function of related functions, or a self-contained hardware or software component that interfaces with a larger system, for example.

Referring again to modules of the controller 302, a buffer manager/bus controller 414 manages buffers in random access memory (RAM) 416 and controls the internal bus arbitration of the controller 302. A read only memory (ROM) 418 stores system boot code. Although illustrated in FIG. 4A as located within the controller 302, in other embodiments one or both of the RAM 416 and the ROM 418 may be located externally to the controller 302. In yet other embodiments, portions of RAM and ROM may be located both within the controller 302 and outside the controller 302.

Front end module 408 includes a host interface 420 and a physical layer interface (PHY) 422 that provide the electrical interface with the host or next level storage controller. The choice of the type of host interface 420 can depend on the type of memory being used. Examples of host interfaces 420 include, but are not limited to, SATA, SATA Express, Serial Attached Small Computer System Interface (SAS), Fibre Channel, USB, PCIe, and NVMe. The host interface 420 typically facilitates transfer for data, control signals, and timing signals.

Back end module 410 includes an error correction code (ECC) engine 111 configured to perform functions described above with reference to FIG. 1. The ECC engine 111 may encode data received from the host, and decode and error correct the data read from the non-volatile memory. A command sequencer 426 generates command sequences, such as program and erase command sequences, to be transmitted to non-volatile memory die 304. A RAID (Redundant Array of Independent Drives) module 428 manages generation of RAID parity and recovery of failed data. The RAID parity may be used as an additional level of integrity protection for the data being written into the non-volatile memory die 304. In some cases, the RAID module 428 may be a part of the ECC engine 111. A memory interface 430 provides the command sequences to non-volatile memory die 304 and receives status information from non-volatile memory die 304. For example, the memory interface 430 may be a double data rate (DDR) interface, such as a Toggle Mode 200, 400, or 800 interface. A flash control layer 432 controls the overall operation of back end module 410. The back end module 410 may also include the comparator 112 and the data validity indicator 114 of FIG. 1.

Additional components of system 400 illustrated in FIG. 4A include a power management module 412 and a media management layer 438, which performs wear leveling of memory cells of non-volatile memory die 304. System 400 also includes other discrete components 440, such as external electrical interfaces, external RAM, resistors, capacitors, or other components that may interface with controller 302. In alternative embodiments, one or more of the physical layer interface 422, RAID module 428, media management layer 438 and buffer management/bus controller 414 are optional components that are omitted from the controller 302.

Figure 4B:
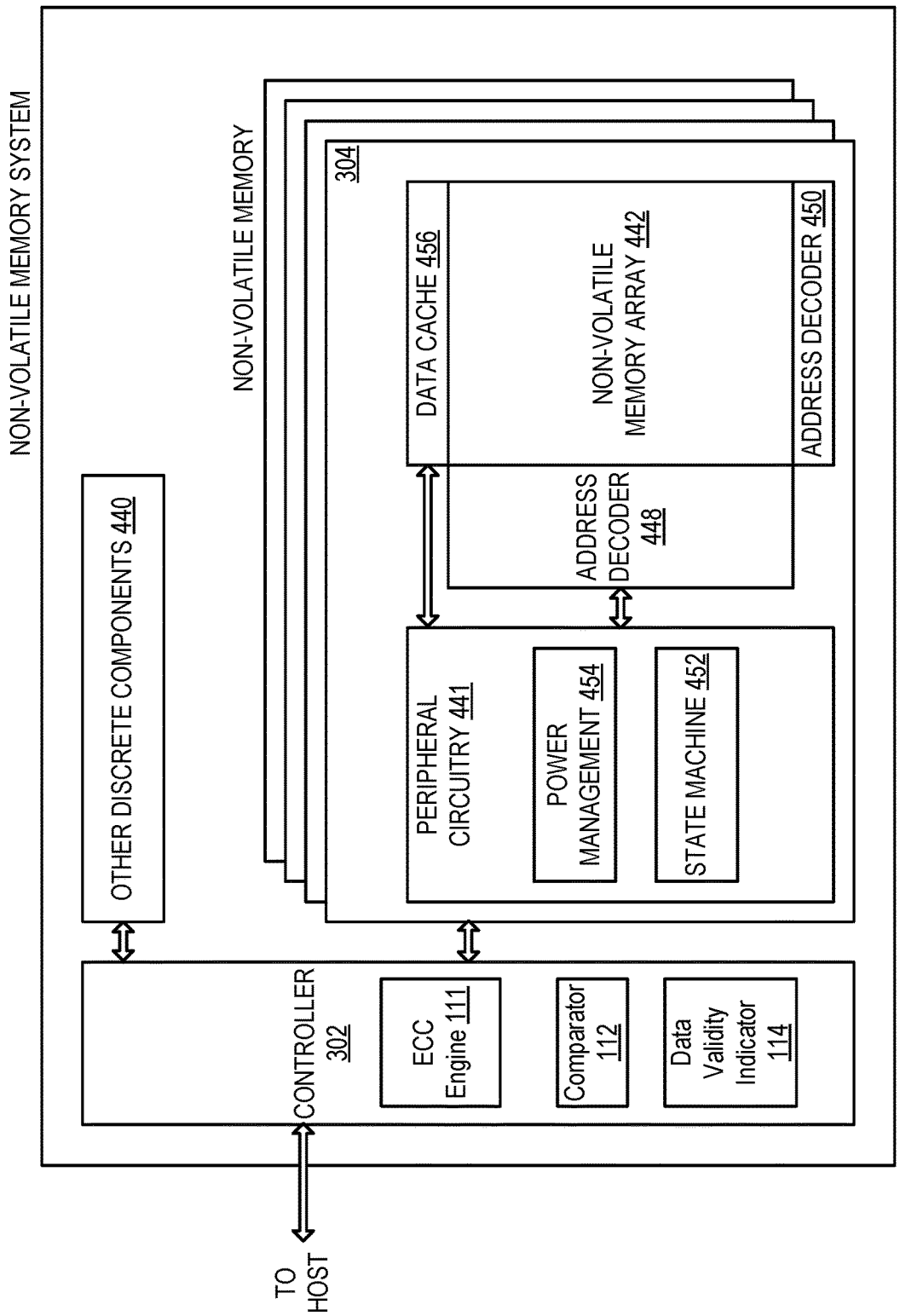
FIG. 4B is a block diagram illustrating exemplary components of a non-volatile memory die that may be coupled to a controller that is configured to perform the relocation operation of FIG. 1.

FIG. 4B is a block diagram illustrating exemplary components of non-volatile memory die 304 in more detail. Non-volatile memory die 304 includes peripheral circuitry 441 and non-volatile memory array 442. Non-volatile memory array 442 includes the non-volatile memory cells used to store data. The non-volatile memory cells may be any suitable non-volatile memory cells, including NAND flash memory cells and/or NOR flash memory cells in a two dimensional and/or three dimensional configuration. Peripheral circuitry 441 includes a state machine 452 that provides status information to controller 302. The peripheral circuitry 441 may also include a power management or data latch control module 454. Non-volatile memory die 304 further includes discrete components 440, an address decoder 448, an address decoder 450, and a data cache 456 that caches data.

Although various components depicted herein are illustrated as block components and described in general terms, such components may include one or more microprocessors, state machines, or other circuits configured to enable the controller 130 to perform a data relocation operation that includes data validity operations as described above with reference to FIG. 1. For example, the ECC engine 111, the comparator 112, the data validity indicator 114, or a combination thereof, may represent physical components, such as hardware controllers, state machines, logic circuits, or other structures, to generate parity bits based on data read from the HMB 142, and perform an operation based on whether the generated parity bits and the read parity bits match or indicate a correctable number of errors as described above with reference to FIG. 1. The ECC engine 111, the comparator 112, the data validity indicator 114, or a combination thereof, may be implemented using a microprocessor or microcontroller programmed to generate parity bits based on data read from the HMB 142 of FIG. 1, compare the generated parity bits to parity bits of data read from the HMB 142, and perform an operation based on whether the generated parity bits and the read parity bits match or indicate a correctable number of errors as described above with reference to FIG. 1.

Although the controller 130 and certain other components described herein are illustrated as block components and described in general terms, such components may include one or more microprocessors, state machines, and/or other circuits configured to enable the data storage device 102 (or one or more components thereof) to perform operations described herein. Components described herein may be operationally coupled to one another using one or more nodes, one or more buses (e.g., data buses and/or control buses), one or more other structures, or a combination thereof. One or more components described herein may include one or more physical components, such as hardware controllers, state machines, logic circuits, one or more other structures, or a combination thereof, to enable the data storage device 102 to perform one or more operations described herein.

Alternatively or in addition, one or more aspects of the data storage device 102 may be implemented using a microprocessor or microcontroller programmed (e.g., by executing instructions) to perform one or more operations described herein, such as one or more operations of the method 200. In a particular embodiment, the data storage device 102 includes a processor executing instructions (e.g., firmware) retrieved from the memory device 103. Alternatively or in addition, instructions that are executed by the processor may be retrieved from memory separate from the memory device 103, such as at a read-only memory (ROM) that is external to the memory device 103.

It should be appreciated that one or more operations described herein as being performed by the controller 130 may be performed at the memory device 103. As an illustrative example, in-memory ECC operations (e.g., encoding operations and/or decoding operations) may be performed at the memory device 103 alternatively or in addition to performing such operations at the controller 130.

The memory device 103 may include a three-dimensional (3D) memory, such as a resistive random access memory (ReRAM), a flash memory (e.g., a NAND memory, a NOR memory, a single-level cell (SLC) flash memory, a multi-level cell (MLC) flash memory, a divided bit-line NOR (DINOR) memory, an AND memory, a high capacitive coupling ratio (HiCR) device, an asymmetrical contactless transistor (ACT) device, or another flash memory), an erasable programmable read-only memory (EPROM), an electrically-erasable programmable read-only memory (EEPROM), a read-only memory (ROM), a one-time programmable memory (OTP), or a combination thereof. Alternatively or in addition, the memory device 103 may include another type of memory. In a particular embodiment, the data storage device 102 is indirectly coupled to an access device (e.g., the access device 170) via a network. For example, the data storage device 102 may be a network-attached storage (NAS) device or a component (e.g., a solid-state drive (SSD) component) of a data center storage system, an enterprise storage system, or a storage area network. The memory device 103 may include a semiconductor memory device.

Semiconductor memory devices include volatile memory devices, such as dynamic random access memory ("DRAM") or static random access memory ("SRAM") devices, non-volatile memory devices, such as resistive random access memory ("ReRAM"), magnetoresistive random access memory ("MRAM"), electrically erasable programmable read only memory ("EEPROM"), flash memory (which can also be considered a subset of EEPROM), ferroelectric random access memory ("FRAM"), and other semiconductor elements capable of storing information. Each type of memory device may have different configurations. For example, flash memory devices may be configured in a NAND or a NOR configuration.

The memory devices can be formed from passive and/or active elements, in any combinations. By way of non-limiting example, passive semiconductor memory elements include ReRAM device elements, which in some embodiments include a resistivity switching storage element, such as an anti-fuse, phase change material, etc., and optionally a steering element, such as a diode, etc. Further by way of non-limiting example, active semiconductor memory elements include EEPROM and flash memory device elements, which in some embodiments include elements containing a charge region, such as a floating gate, conductive nanoparticles, or a charge storage dielectric material.

Multiple memory elements may be configured so that they are connected in series or so that each element is individually accessible. By way of non-limiting example, flash memory devices in a NAND configuration (NAND memory) typically contain memory elements connected in series. A NAND memory array may be configured so that the array is composed of multiple strings of memory in which a string is composed of multiple memory elements sharing a single bit line and accessed as a group. Alternatively, memory elements may be configured so that each element is individually accessible, e.g., a NOR memory array. NAND and NOR memory configurations are exemplary, and memory elements may be otherwise configured.

The semiconductor memory elements located within and/or over a substrate may be arranged in two or three dimensions, such as a two dimensional memory structure or a three dimensional memory structure. In a two dimensional memory structure, the semiconductor memory elements are arranged in a single plane or a single memory device level. Typically, in a two dimensional memory structure, memory elements are arranged in a plane (e.g., in an x-z direction plane) which extends substantially parallel to a major surface of a substrate that supports the memory elements. The substrate may be a wafer over or in which the layer of the memory elements are formed or it may be a carrier substrate which is attached to the memory elements after they are formed. As a non-limiting example, the substrate may include a semiconductor such as silicon.

The memory elements may be arranged in the single memory device level in an ordered array, such as in a plurality of rows and/or columns. However, the memory elements may be arrayed in non-regular or non-orthogonal configurations. The memory elements may each have two or more electrodes or contact lines, such as bit lines and word lines.

A three dimensional memory array is arranged so that memory elements occupy multiple planes or multiple memory device levels, thereby forming a structure in three dimensions (i.e., in the x, y and z directions, where they direction is substantially perpendicular and the x and z directions are substantially parallel to the major surface of the substrate). As a non-limiting example, a three dimensional memory structure may be vertically arranged as a stack of multiple two dimensional memory device levels. As another non-limiting example, a three dimensional memory array may be arranged as multiple vertical columns (e.g., columns extending substantially perpendicular to the major surface of the substrate, i.e., in they direction) with each column having multiple memory elements in each column. The columns may be arranged in a two dimensional configuration, e.g., in an x-z plane, resulting in a three dimensional arrangement of memory elements with elements on multiple vertically stacked memory planes. Other configurations of memory elements in three dimensions can also constitute a three dimensional memory array.

By way of non-limiting example, in a three dimensional NAND memory array, the memory elements may be coupled together to form a NAND string within a single horizontal (e.g., x-z) memory device levels. Alternatively, the memory elements may be coupled together to form a vertical NAND string that traverses across multiple horizontal memory device levels. Other three dimensional configurations can be envisioned wherein some NAND strings contain memory elements in a single memory level while other strings contain memory elements which span through multiple memory levels. Three dimensional memory arrays may also be designed in a NOR configuration and in a ReRAM configuration.

Typically, in a monolithic three dimensional memory array, one or more memory device levels are formed above a single substrate. Optionally, the monolithic three dimensional memory array may also have one or more memory layers at least partially within the single substrate. As a non-limiting example, the substrate may include a semiconductor such as silicon. In a monolithic three dimensional array, the layers constituting each memory device level of the array are typically formed on the layers of the underlying memory device levels of the array. However, layers of adjacent memory device levels of a monolithic three dimensional memory array may be shared or have intervening layers between memory device levels.

Alternatively, two dimensional arrays may be formed separately and then packaged together to form a non-monolithic memory device having multiple layers of memory. For example, non-monolithic stacked memories can be constructed by forming memory levels on separate substrates and then stacking the memory levels atop each other. The substrates may be thinned or removed from the memory device levels before stacking, but as the memory device levels are initially formed over separate substrates, the resulting memory arrays are not monolithic three dimensional memory arrays. Further, multiple two dimensional memory arrays or three dimensional memory arrays (monolithic or non-monolithic) may be formed on separate chips and then packaged together to form a stacked-chip memory device.

Associated circuitry is typically required for operation of the memory elements and for communication with the memory elements. As non-limiting examples, memory devices may have circuitry used for controlling and driving memory elements to accomplish functions such as programming and reading. This associated circuitry may be on the same substrate as the memory elements and/or on a separate substrate. For example, a controller for memory read-write operations may be located on a separate controller chip and/or on the same substrate as the memory elements.

One of skill in the art will recognize that this disclosure is not limited to the two dimensional and three dimensional exemplary structures described but cover all relevant memory structures within the spirit and scope of the disclosure as described herein and as understood by one of skill in the art. The illustrations of the embodiments described herein are intended to provide a general understanding of the various embodiments. Other embodiments may be utilized and derived from the disclosure, such that structural and logical substitutions and changes may be made without departing from the scope of the disclosure. This disclosure is intended to cover any and all subsequent adaptations or variations of various embodiments. Those of skill in the art will recognize that such modifications are within the scope of the present disclosure.

The above-disclosed subject matter is to be considered illustrative, and not restrictive, and the appended claims are intended to cover all such modifications, enhancements, and other embodiments, that fall within the scope of the present disclosure. Thus, to the maximum extent allowed by law, the scope of the present disclosure is to be determined by the broadest permissible interpretation of the following claims and their equivalents, and shall not be restricted or limited by the foregoing detailed description.

What is claimed is:

1. A data storage device comprising:
   a memory device; and
   a memory controller coupled to the memory device and configured, during execution of a relocation operation to:
   send data and a first error correction code (ECC) parity bits from a first portion of the memory device to a memory buffer of an access device, wherein the data and the first error correction code are sent to the memory buffer, wherein the memory buffer is a host memory buffer;
   retrieve the sent data including data bits and the first error correction code (ECC) parity bits from the memory buffer;
   generate second ECC parity bits based on the retrieved data bits from the memory buffer;
   compare the first ECC parity bits to the second ECC parity bits; and
   either:
   deliver the retrieved data bits and the first ECC parity bits to a second portion of the memory device; or
   re-execute the relocation operation, wherein the memory controller is configured to send the data and the first ECC parity bits to the host memory buffer.

2. The data storage device of claim 1, wherein the memory controller includes an ECC engine configured to generate the second ECC parity bits based on the data bits of the data read from the memory buffer.

3. The data storage device of claim 2, wherein the memory controller is further configured to re-execute the relocation operation based on a comparison indicating that the data bits of the data read from the memory buffer include an uncorrectable number of errors.

4. The data storage device of claim 1, wherein the data stored to the memory buffer is based on data stored at the first portion of the memory device, and wherein the memory controller is further configured to write the data read from the memory buffer to the second portion of the memory device based on the first ECC parity bits of the data read from the memory buffer matching the second ECC parity bits.

5. The data storage device of claim 1, wherein the memory controller is further configured to re-execute the relocation operation based on a comparison indicating that the first ECC parity bits read from the memory buffer do not match the second ECC parity bits.

6. The data storage device of claim 1, wherein the memory controller is further configured to, during execution of the relocation operation, generate corrected data by performing a correction operation on the data read from the memory buffer based on a comparison of the first ECC parity bits of the data read from the memory buffer to the second ECC parity bits indicating that the data bits of the data read from the memory buffer include a correctable number of errors.

7. The data storage device of claim 6, wherein the data stored to the memory buffer is based on data stored at the first portion of the memory device, and wherein the memory controller is further configured to, during execution of the relocation operation, write the corrected data to the second portion of the memory device.

8. A data storage device comprising:
   a memory device including a first portion and a second portion; and
   a memory controller coupled to the memory device, the memory controller including:
   an error correction code (ECC) engine configured, during a relocation operation to:
   relocate data from the first portion to the second portion via a host memory buffer of an access device, wherein the data is sent to a memory buffer, wherein the memory buffer is the host memory buffer;
   generate first ECC parity bits based on data bits of the data read from the first portion and to generate second ECC parity bits based on data bits of data read from the host memory buffer, the data read from the host memory buffer including the first ECC parity bits; and
   a comparator configured to:
   compare the second ECC parity bits to the first ECC parity bits read from the host memory buffer, wherein the memory controller is configured to write data based on the data read from the host memory buffer to the second portion of the memory device based on a comparison; and
   either:
   deliver the retrieved data bits and the first ECC parity bits to a second location of the memory device or;
   repeat execution of the relocation operation, wherein the memory controller is configured to send the data and the first ECC parity bits to the host memory buffer.

9. The data storage device of claim 8, wherein the memory controller is configured to write the data read from the portion of the host memory buffer to the second portion of the memory device based on the comparison indicating that the first ECC parity bits match the second ECC parity bits.

10. The data storage device of claim 8, wherein the ECC engine is configured to generate corrected data based on the data read from the host memory buffer based on the comparison indicating that the data read from the host memory buffer includes a correctable number of errors.

11. The data storage device of claim 10, wherein the memory controller is configured to write the corrected data to the second portion of the memory device based on the comparison indicating that the data read from the host memory buffer includes the correctable number of errors.

12. The data storage device of claim 8, wherein the memory controller is configured to not write the data read from the host memory buffer to the second portion of the memory device based on the comparison indicating that the first ECC parity bits do not match the second ECC parity bits.

13. The data storage device of claim 12, wherein the memory controller is configured, during execution of the relocation operation and based on the comparison indicating that the first ECC parity bits do not match the second ECC parity bits, to read the data stored at the first portion of the memory device and to write the data read from the first portion of the memory device to the host memory buffer.

14. The data storage device of claim 13, wherein the ECC engine is configured, during execution of the relocation operation, to generate third ECC parity bits based on data read from the host memory buffer during a second read of the host memory buffer.

15. A method performed by a memory controller coupled to a memory device, the method comprising:
sending, during a relocation operation, data and a first error correction code (ECC) parity bits to a memory buffer of an access device, wherein the data and the first error correction code are sent to the memory buffer, wherein the memory buffer is a host memory buffer;
retrieving the data stored to the memory buffer including data bits of data read from a first portion of the memory device and including the first error correction code (ECC) parity bits;
reading data from the memory buffer, the data read from the memory buffer including the data bits and the first ECC parity bits; and
comparing the first ECC parity bits of the data read from the memory buffer to second ECC parity bits generated based on the data bits of the data read from the memory buffer; and
either:
deliver the retrieved data and the first ECC parity bits to a location of the memory device; or
repeat execution of the relocation operation, wherein the memory controller is configured to send the data and the first ECC parity bits to the host memory buffer.

16. The method of claim 15, further comprising re-executing the relocation operation based on a comparison indicating that the data bits of the data read from the memory buffer include an uncorrectable number of errors.

17. The method of claim 15, further comprising writing the data read from the portion of the memory buffer to a second portion of the memory device based on the first ECC parity bits of the data read from the memory buffer matching the second ECC parity bits.

18. The method of claim 15, further comprising re-executing the relocation operation based on a comparison indicating that the first ECC parity bits read from the memory buffer do not match the second ECC parity bits.

19. The method of claim 15, further comprising generating, during execution of the relocation operation, corrected data by performing a correction operation on the data read from the memory buffer based on a comparison of the first ECC parity bits of the data read from the memory buffer to the second ECC parity bits indicating that the data bits of the data read from the memory buffer include a correctable number of errors.

20. The method of claim 19, further comprising writing, during execution of the relocation operation, the corrected data to a second portion of the memory device.

* * * * *